(12) United States Patent
Kawadahara

(10) Patent No.: US 11,776,931 B2
(45) Date of Patent: Oct. 3, 2023

(54) SUBSTRATE BONDING APPARATUS, MANUFACTURING SYSTEM, AND SEMICONDUCTOR DEVICE MANUFACTURING METHOD

(71) Applicant: Kioxia Corporation, Minato-ku (JP)

(72) Inventor: Sho Kawadahara, Yokkaichi (JP)

(73) Assignee: Kioxia Corporation, Minato-ku (JP)

( * ) Notice: Subject to any disclaimer, the term of this patent is extended or adjusted under 35 U.S.C. 154(b) by 789 days.

(21) Appl. No.: 16/815,157

(22) Filed: Mar. 11, 2020

(65) Prior Publication Data
US 2021/0074670 A1 Mar. 11, 2021

(30) Foreign Application Priority Data
Sep. 5, 2019 (JP) .................. 2019-162027

(51) Int. Cl.
*H01L 23/00* (2006.01)
*H01L 21/677* (2006.01)
(Continued)

(52) U.S. Cl.
CPC ........ *H01L 24/75* (2013.01); *H01L 21/67173* (2013.01); *H01L 21/67259* (2013.01);
(Continued)

(58) Field of Classification Search
CPC ............... H01L 24/75; H01L 21/67173; H01L 21/67259; H01L 21/67706; H01L 21/681; H01L 24/83; H01L 2224/75001; H01L 2224/75753; H01L 2224/75755; H01L 2224/75804; H01L 2224/75901; H01L 2224/83132; H01L 2224/8316; H01L 24/80; H01L 24/74; H01L 2224/08145; H01L 2224/75701; H01L 2224/75702; H01L 2224/758; H01L 2224/80125; H01L 2224/80127; H01L 2224/80895; H01L 2224/80896; H01L 2224/94;
(Continued)

(56) References Cited

U.S. PATENT DOCUMENTS

2010/0120222 A1* 5/2010 Kim ...................... H01L 21/324
438/455

FOREIGN PATENT DOCUMENTS

GB 2433819 A * 7/2007 ........... G02F 1/1303
JP WO2009/022457 A1 2/2009
(Continued)

*Primary Examiner* — Ermias T Woldegeorgis
(74) *Attorney, Agent, or Firm* — Oblon, McClelland, Maier & Neustadt, L.L.P.

(57) ABSTRACT

According to one embodiment, there is provided a substrate bonding apparatus including a first chucking stage, a second chucking stage, and an alignment unit. The first chucking stage is configured to chuck a first substrate. The second chucking stage is disposed facing the first chucking stage. The second chucking stage is configured to chuck a second substrate. The alignment unit is configured to be inserted between the first chucking stage and the second chucking stage. The alignment unit includes a base body, a first detection element, and a second detection element. The base body includes a first main face and a second main face opposite to the first main face. The first detection element is disposed on the first main face. The second detection element is disposed on the second main face.

16 Claims, 9 Drawing Sheets

(51) Int. Cl.
*H01L 21/68* (2006.01)
*H01L 21/67* (2006.01)

(52) U.S. Cl.
CPC ...... *H01L 21/67706* (2013.01); *H01L 21/681* (2013.01); *H01L 24/83* (2013.01); *H01L 2224/75001* (2013.01); *H01L 2224/75753* (2013.01); *H01L 2224/75755* (2013.01); *H01L 2224/75804* (2013.01); *H01L 2224/75901* (2013.01); *H01L 2224/8316* (2013.01); *H01L 2224/83132* (2013.01)

(58) Field of Classification Search
CPC ........... H01L 21/67092; H01L 21/6838; H01L 21/68764; H01L 21/67253
See application file for complete search history.

(56) References Cited

FOREIGN PATENT DOCUMENTS

| | | |
|---|---|---|
| JP | 4548239 B2 | 9/2010 |
| JP | 2013-187393 A | 9/2013 |
| JP | 5626710 B2 | 11/2014 |
| JP | 2016-146411 A | 8/2016 |
| JP | 2017-187531 A | 10/2017 |
| TW | 201044082 A1 | 12/2010 |
| TW | 201433860 A | 9/2014 |

\* cited by examiner

FIG.6A
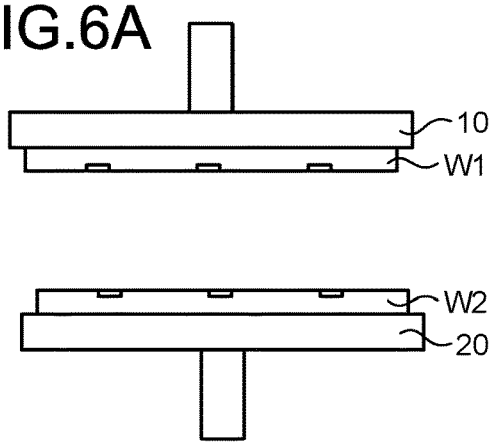
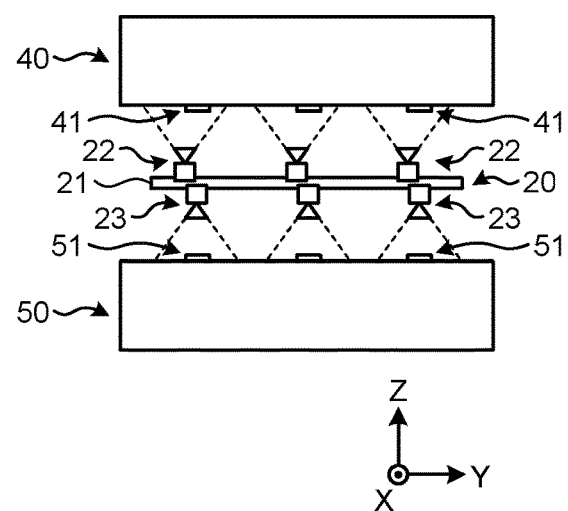
FIG.6B
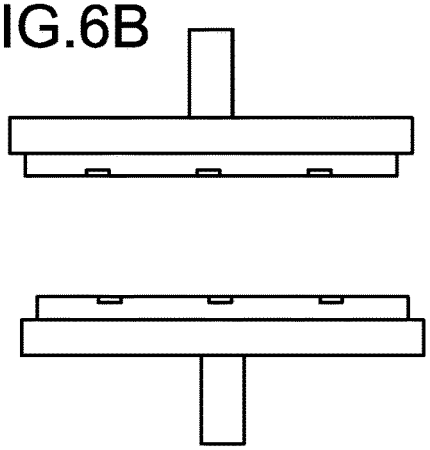
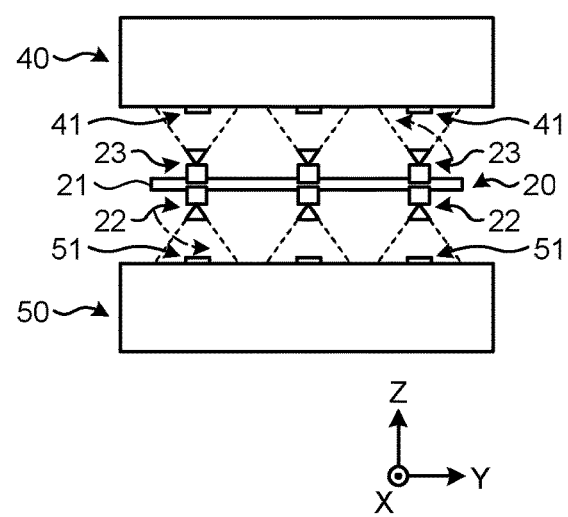
FIG.6C
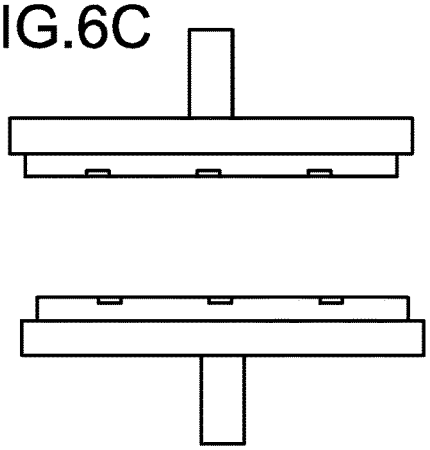
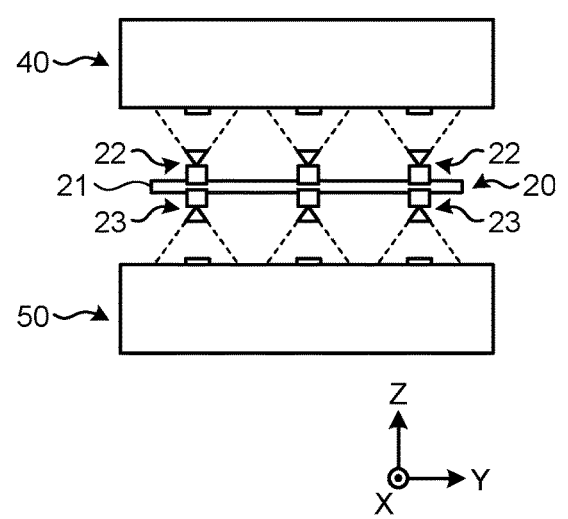

SUBSTRATE BONDING APPARATUS, MANUFACTURING SYSTEM, AND SEMICONDUCTOR DEVICE MANUFACTURING METHOD

CROSS-REFERENCE TO RELATED APPLICATIONS

This application is based upon and claims the benefit of priority from Japanese Patent Application No. 2019-162027, filed on Sep. 5, 2019; the entire contents of which are incorporated herein by reference.

FIELD

Embodiments described herein relate generally to a substrate bonding apparatus, a manufacturing system, and a semiconductor device manufacturing method.

BACKGROUND

A substrate bonding apparatus chucks two substrates on two chucking stages, and bonds the two substrates to each other. At this time, it is desirable to bond the two substrates with high accuracy.

BRIEF DESCRIPTION OF THE DRAWINGS

FIGS. 6A to 6C are diagrams illustrating part of the operation of the substrate bonding apparatus according to the embodiment;

DETAILED DESCRIPTION

Figure 1:
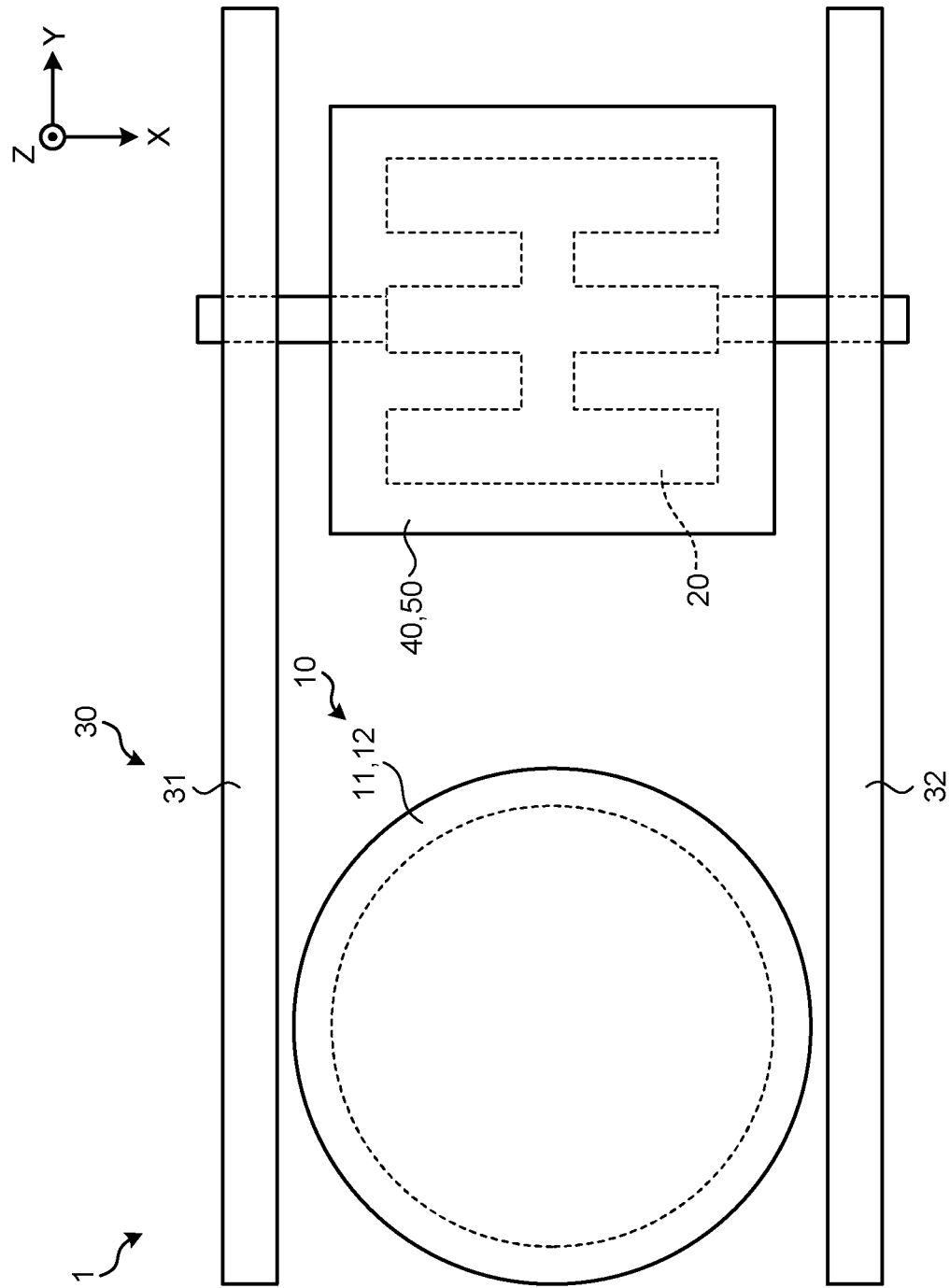
FIG. 1 is a plan view illustrating a configuration of a substrate bonding apparatus according to an embodiment.

In general, according to one embodiment, there is provided a substrate bonding apparatus including a first chucking stage, a second chucking stage, and an alignment unit. The first chucking stage is configured to chuck a first substrate. The second chucking stage is disposed facing the first chucking stage. The second chucking stage is configured to chuck a second substrate. The alignment unit is configured to be inserted between the first chucking stage and the second chucking stage. The alignment unit includes a base body, a first detection element, and a second detection element. The base body includes a first main face and a second main face opposite to the first main face. The first detection element is disposed on the first main face. The second detection element is disposed on the second main face.

Exemplary embodiments of a substrate bonding apparatus will be explained below in detail with reference to the accompanying drawings. The present invention is not limited to the following embodiments.

EMBODIMENT

An explanation will be given of a substrate bonding apparatus according to an embodiment. A substrate bonding apparatus chucks two substrates (such as two wafers) on two chucking stages, and bonds the two substrates to each other. At this time, it is desirable to bond the two substrates with high accuracy.

For this purpose, it is conceivable to make the first substrate thinner by polishing, and perform observation with infrared light from the rear face of the first substrate to align the first substrate and the second substrate with each other through the rear face of the first substrate. In this case, thinning is performed to set the thickness of the substrate portion of the first substrate (for example, the thickness of a silicon remaining film on the rear face) to be smaller than the thickness through which infrared light can be transmitted. Consequently, the first substrate tends to be easily warped, and thus voids can be easily formed at the interface between the first substrate and the second substrate at the time of bonding therebetween. Further, as a process of thinning the first substrate is added, the number of processes involved in the bonding becomes larger, and thus the manufacturing cost may be increased.

Further, it is conceivable to perform alignment between the first chucking stage and the second chucking stage, thereby to indirectly align the first substrate and the second substrate with each other. In this indirect alignment, there is a case where the relative position of the first substrate to the first chucking stage differs from the relative position of the second substrate to the second chucking stage. In this case, even when alignment is performed between the first chucking stage and the second chucking stage, as the first substrate and the second substrate are shifted in position, it is difficult to improve the accuracy of alignment between the first substrate and the second substrate.

In consideration of the above, in the substrate bonding apparatus according to the embodiment, an alignment unit provided with detection elements on the opposite faces is inserted between two chucking stages in a state where the detection elements on the opposite faces are mutually aligned. Then, the detection elements on the opposite faces of the alignment unit are used to perform alignment between the two substrates. This aims to achieve an improvement in the bonding accuracy at a low cost.

Figure 2:
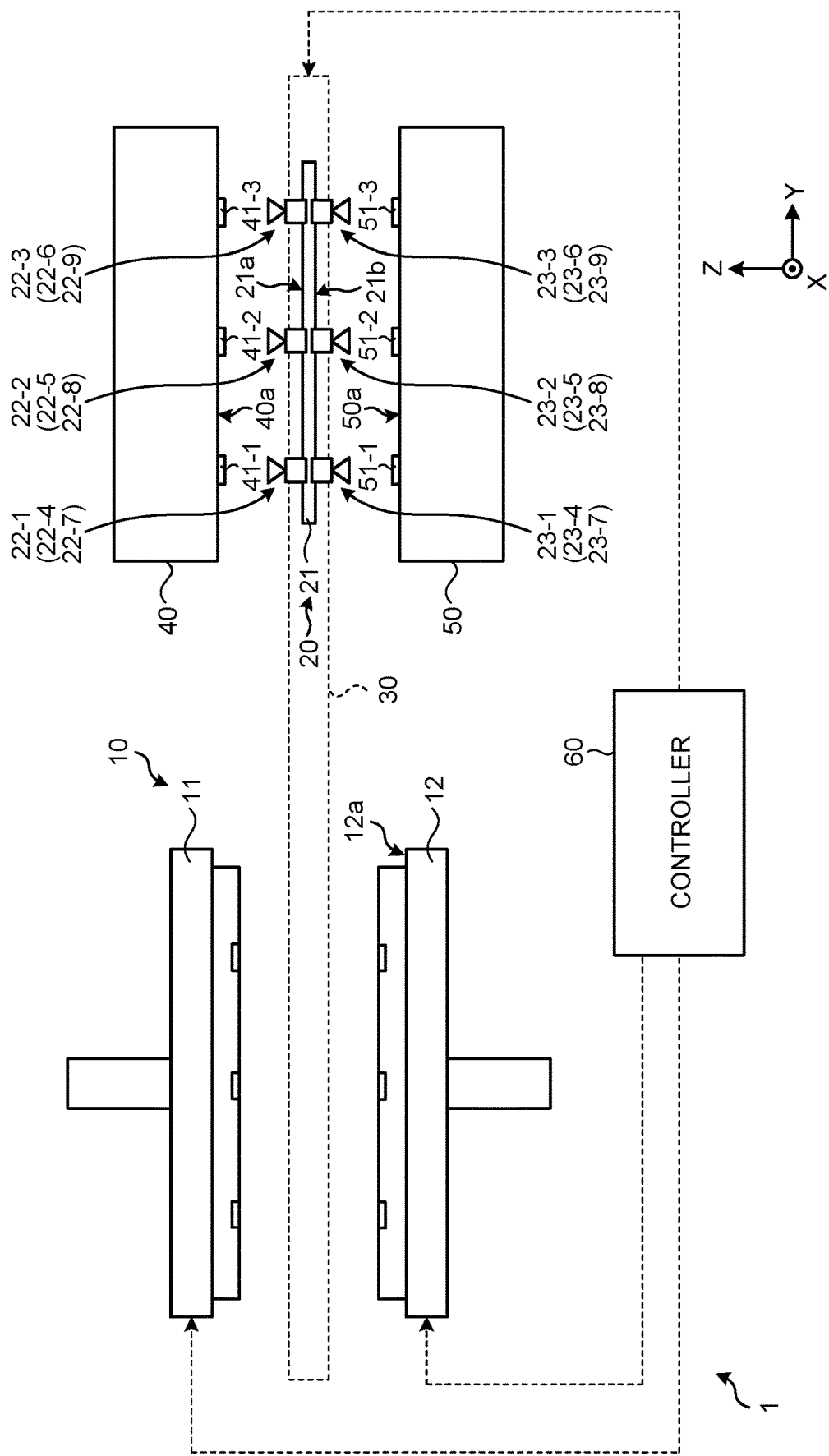
FIG. 2 is a side view illustrating a configuration of the substrate bonding apparatus according to the embodiment.

Specifically, the substrate bonding apparatus 1 is configured as illustrated in FIGS. 1 and 2. FIG. 1 is a plan view illustrating a configuration of the substrate bonding apparatus 1. FIG. 2 is a side view illustrating a configuration of the substrate bonding apparatus 1.

The substrate bonding apparatus 1 performs alignment between two substrates, before bonding the two substrates to each other. As a reference for this alignment (an absolute alignment reference), an alignment unit provided with detection elements on the opposite faces is used, in a state where detection elements on the opposite faces are mutually aligned. For example, the substrate bonding apparatus 1 includes a bonding section 10, an alignment unit 20, a guide structure 30, a calibration stage 40, a calibration stage 50, and a controller 60.

The bonding section 10 is configured to bond two substrates to each other. The bonding section 10 includes a chucking stage 11 and a chucking stage 12. The chucking stage 11 and the chucking stage 12 are disposed to face each other in use. The chucking stage 11 includes a main face 11a on the side facing the chucking stage 12, and the chucking stage 12 includes a main face 12a on the side facing the chucking stage 11. Hereinafter, it is assumed that the direction perpendicular to the main face 12a of the chucking stage 12 is a Z-direction and the two directions orthogonal to each other in the plane perpendicular to the Z-direction are an X-direction and a Y-direction.

The alignment unit 20 functions as an absolute alignment reference in alignment between two substrates to be mutually bonded. The alignment unit 20 can be inserted between the calibration stage 40 and the calibration stage (at a calibration execution position), and can also be inserted between the chucking stage 11 and the chucking stage 12 (at an alignment execution position).

Figure 3:
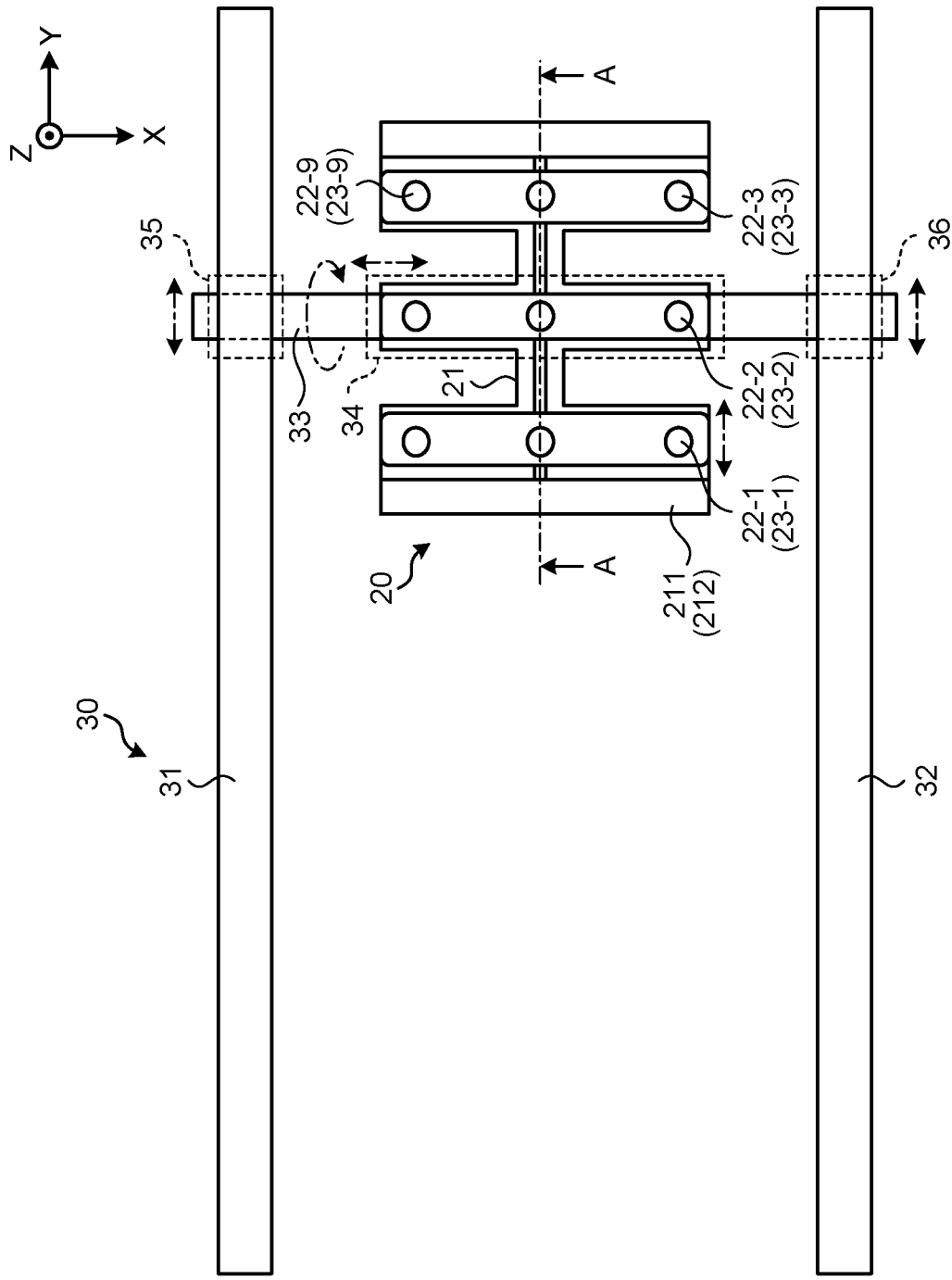
FIG. 3 is a plan view illustrating a configuration of an alignment unit in the embodiment.
Figure 4:
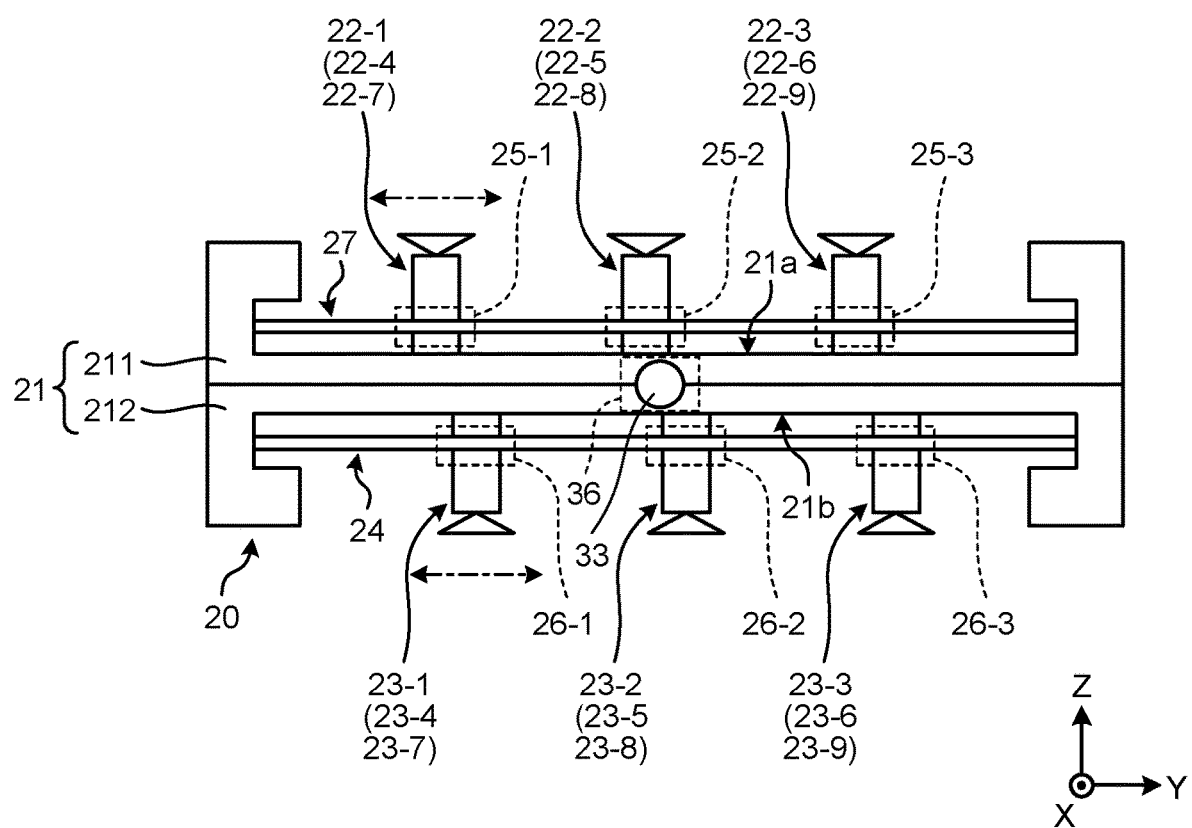
FIG. 4 is an enlarged sectional view illustrating a configuration of the alignment unit in the embodiment.

As illustrated in FIGS. 3 and 4, the alignment unit 20 includes a base body 21, a plurality of detection elements 22-1 to 22-9, a plurality of detection elements 23-1 to 23-9, a rail 27, a rail 24, a plurality of drive mechanisms 25-1 to 25-3, and a plurality of drive mechanisms 26-1 to 26-3. FIG. 3 is a plan view illustrating a configuration of the alignment unit 20. FIG. 4 is an enlarged sectional view illustrating a configuration of the alignment unit 20, which illustrates a cross section taken along a line A-A of FIG. 3.

The base body 21 may have an arm-shaped contour obtained by combining a substantially H shape with a substantially I shape, or may have a flat plate contour extending in the X- and Y-directions, when seen in the XY-plane. In the configuration illustrated as an example in FIG. 1, the base body 21 has the arm-shaped contour. The base body 21 includes a main face 21a on the +Z-side, and a main face 21b on the −Z-side. The base body 21 includes an upper base 211 and a lower base 212. The upper base 211 includes a main portion extending in the X- and Y-directions along the arm-shaped contour and a rising portion rising up in the +Z-direction from the main portion. The lower base 212 includes a main portion extending in the X- and Y-directions along the arm-shaped contour and a rising portion rising up in the −Z-direction from the main portion.

The plurality of detection elements 22-1 to 22-9 are disposed on the main face 21a of the base body 21. At the calibration execution position, each of the detection elements 22-1 to 22-9 images a reference mark on the calibration stage 40 under the control of the controller 60. Each of the detection elements 22-1 to 22-9 may include a camera, such as a CCD image sensor or CMOS image sensor.

The plurality of detection elements 23-1 to 23-9 are disposed on the main face 21b of the base body 21. At the calibration execution position, each of the detection elements 23-1 to 23-9 images a reference mark on the calibration stage 50 under the control of the controller 60. Each of the detection elements 23-1 to 23-9 may include a camera, such as a CCD image sensor or CMOS image sensor.

The rail 27 extends in the Y-direction while passing through the central portion of the base body 21, when seen in the XY-plane, such that each of the +Y-side end and the −Y-side end is connected to the rising portion of the upper base 211. The rail 27 is configured to allow the plurality of detection elements 22-1 to 22-9 to slide thereon. The rail 27 is a member separate from the rail 24, and the plurality of detection elements 22-1 to 22-9 can move on the main face 21a independently of the plurality of detection elements 23-1 to 23-9.

The rail 24 extends in the Y-direction while passing through the central portion of the base body 21, when seen in the XY-plane, such that each of the +Y-side end and the −Y-side end is connected to the rising portion of the lower base 212. The rail 24 is configured to allow the plurality of detection elements 23-1 to 23-9 to slide thereon. The rail 24 is a member separate from the rail 27, and the plurality of detection elements 23-1 to 23-9 can move on the main face 21b independently of the plurality of detection elements 22-1 to 22-9.

The plurality of drive mechanisms 25-1 to 25-3 cause the plurality of detection elements 22-1 to 22-9 to slide along the rail 27 under the control of the controller 60. The plurality of drive mechanisms 25-1 to 25-3 control the drive of the plurality of detection elements 22-1 to 22-9 independently of the plurality of drive mechanisms 26-1 to 26-3. Consequently, the plurality of detection elements 22-1 to 22-9 are driven separately from the plurality of detection elements 23-1 to 23-9.

The drive mechanism 25-1 causes the detection elements 22-1, 22-4, and 22-7 to slide along the rail 27 under the control of the controller 60. The drive mechanism 25-2 causes the detection elements 22-2, 22-5, and 22-8 to slide along the rail 27 under the control of the controller 60. The drive mechanism 25-3 causes the detection elements 22-3, 22-6, and 22-9 to slide along the rail 27 under the control of the controller 60. Each of the drive mechanisms 25-1 to 25-3 includes a linear motor, for example. Each of the drive mechanisms 25-1 to 25-3 includes a mover provided on one of the detection elements 22-1 to 22-9 side and the rail 27 side and a stator provided on the other side. One of the mover and the stator includes a permanent magnet and the other includes an electromagnet.

Here, in a case where the relative positional relationship among the plurality of detection elements 22-1 to 22-9 has been subjected to accurate alignment made in advance, the plurality of detection elements 22-1 to 22-9 may be driven collectively by one drive mechanism 25.

The plurality of drive mechanisms 26-1 to 26-3 cause the plurality of detection elements 23-1 to 23-9 to slide along the rail 24 under the control of the controller 60. The plurality of drive mechanisms 26-1 to 26-3 control the drive of the plurality of detection elements 23-1 to 23-9 independently of the plurality of drive mechanisms 25-1 to 25-3. Consequently, the plurality of detection elements 23-1 to 23-9 are driven separately from the plurality of detection elements 22-1 to 22-9.

The drive mechanism 26-1 causes the detection elements 23-1, 23-4, and 23-7 to slide along the rail 24 under the control of the controller 60. The drive mechanism 26-2 causes the detection elements 23-2, 23-5, and 23-8 to slide along the rail 24 under the control of the controller 60. The drive mechanism 26-3 causes the detection elements 23-3, 23-6, and 23-9 to slide along the rail 24 under the control of the controller 60. Each of the drive mechanisms 26-1 to 26-3 includes a linear motor, for example. Each of the drive mechanisms 26-1 to 26-3 includes a mover provided on one of the detection elements 23-1 to 23-9 side and the rail 24 side and a stator provided on the other side. One of the mover and the stator includes a permanent magnet and the other includes an electromagnet.

Here, in a case where the relative positional relationship among the plurality of detection elements 23-1 to 23-9 has been subjected to accurate alignment made in advance, the plurality of detection elements 23-1 to 23-9 may be driven collectively by one drive mechanism 26.

The guide structure 30 is configured to allow the alignment unit 20 to travel thereon. The guide structure 30 guides the move of the alignment unit 20 between a position corresponding to the chucking stage 11 and the chucking stage 12 (the alignment execution position) and a position corresponding to the calibration stage 40 and the calibration stage 50 (the calibration execution position). The guide structure 30 includes a guide rail 31, a guide rail 32, a support arm 33, a drive mechanism 34, a drive mechanism 35, and a drive mechanism 36.

The guide rail 31 extends in the Y-direction to joint to each other the position corresponding to the chucking stage 11 and the chucking stage 12 (the alignment execution position) and the position corresponding to the calibration stage 40 and the calibration stage 50 (the calibration execution position). The guide rail 31 has substantially the same Z-height as the guide rail 32. The guide rail 31 is present on the −X-side of the chucking stage 11 and the chucking stage 12, and is also present on the −X-side of the calibration stage 40 and the calibration stage 50.

The guide rail 32 extends in the Y-direction to joint to each other the alignment execution position and the calibration execution position. The guide rail 32 has substantially the same Z-height as the guide rail 31. The guide rail 32 is present on the +X-side of the chucking stage 11 and the chucking stage 12, and is also present on the +X-side of the calibration stage 40 and the calibration stage 50.

The support arm 33 is disposed intersecting with the guide rail 31 and the guide rail 32, when seen in the XY-plane. The support arm 33 is configured such that the −X-side end can slide along the guide rail 31 and the +X-side end can slide along the guide rail 32. Further, the support arm 33 supports the alignment unit 20 (base body 21) such that the alignment unit 20 can slide in the X-direction between the guide rail 31 and the guide rail 32.

The drive mechanism 34 causes the base body 21 to slide in the X-direction along the support arm 33 under the control of the controller 60. The drive mechanism 34 includes a linear motor, for example. The drive mechanism 34 includes a mover provided on one of the base body 21 and the support arm 33 and a stator provided on the other. One of the mover and the stator includes a permanent magnet and the other includes an electromagnet.

Further, the drive mechanism 34 rotates the base body 21 about the axis of the support arm 33 (in a rotational direction about an X-axis) under the control of the controller 60. The drive mechanism 34 further includes a rotary motor, for example.

The drive mechanism 35 causes the −X-side end of the support arm 33 to slide in the Y-direction along the guide rail 31 under the control of the controller 60. The drive mechanism 35 includes a linear motor, for example. The drive mechanism 35 includes a mover provided on one of the support arm 33 and the guide rail 31 and a stator provided on the other. One of the mover and the stator includes a permanent magnet and the other includes an electromagnet.

The drive mechanism 36 causes the +X-side end of the support arm 33 to slide in the Y-direction along the guide rail 32 under the control of the controller 60. The drive mechanism 36 includes a linear motor, for example. The drive mechanism 36 includes a mover provided on one of the support arm 33 and the guide rail 32 and a stator provided on the other. One of the mover and the stator includes a permanent magnet and the other includes an electromagnet.

As illustrated in FIG. 2, the calibration stage 40 is disposed at a position to face the +Z-side of the alignment unit 20 when the alignment unit 20 is present at the calibration execution position. The calibration stage 40 has a substantially flat plate shape extending in the X- and Y-directions, and includes a plurality of reference marks 41-1 to 41-3 for calibration on the −Z-side main face 40*a*.

The calibration stage 50 is disposed at a position to face the −Z-side of the alignment unit 20 when the alignment unit 20 is present at the calibration execution position. The calibration stage 50 has a substantially flat plate shape extending in the X- and Y-directions, and includes a plurality of reference marks 51-1 to 51-3 for calibration on the +Z-side main face 50*a*.

Figure 5:
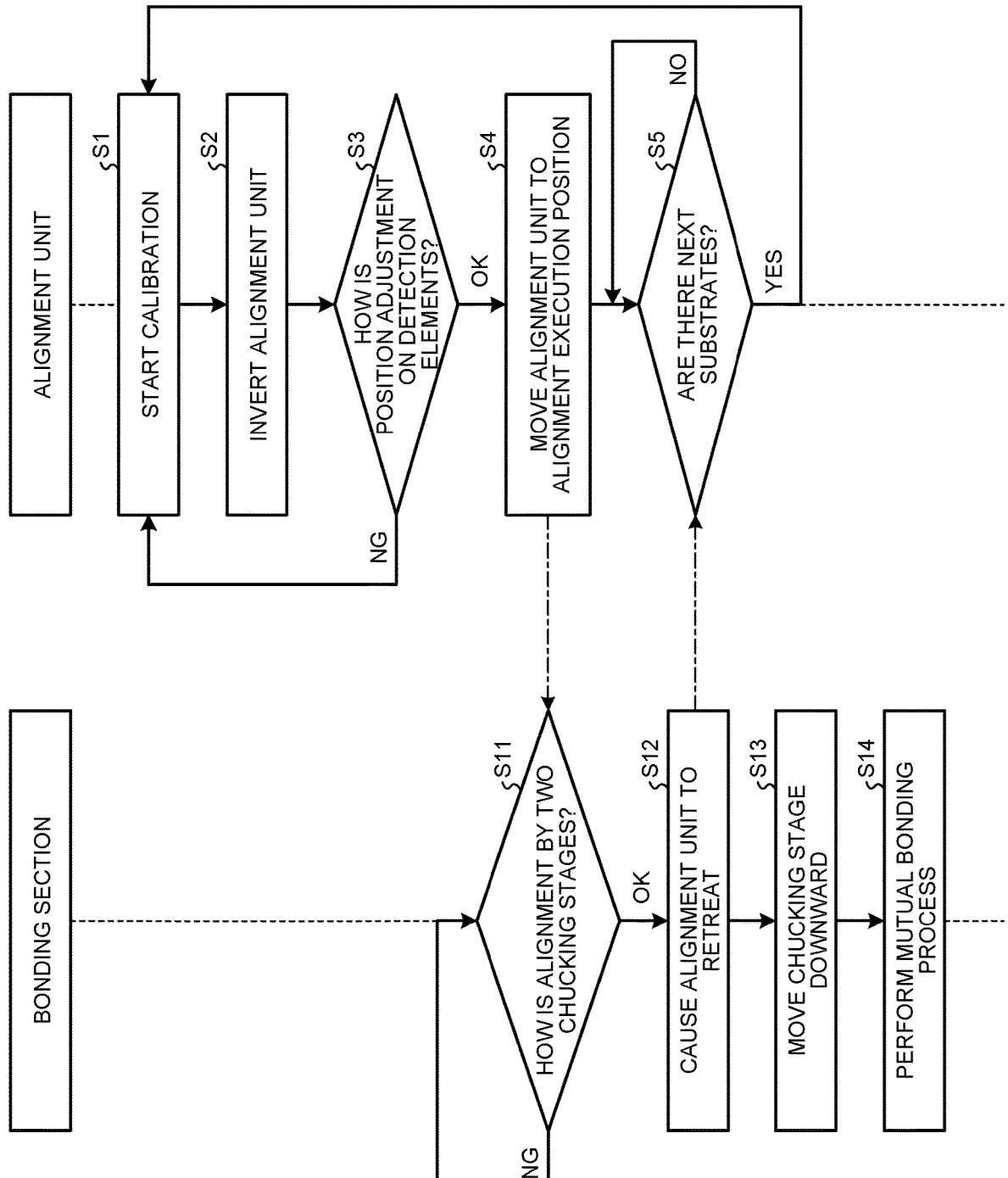
FIG. 5 is a flowchart illustrating an operation of the substrate bonding apparatus according to the embodiment.

The controller 60 is configured to perform overall control on the respective parts of the substrate bonding apparatus 1. For example, the controller 60 performs an operation as illustrated in FIGS. 5 to 8B. FIG. 5 is a flowchart illustrating an operation of the substrate bonding apparatus 1. FIGS. 6A to 8B are diagrams illustrating the operation of the substrate bonding apparatus 1.

As illustrated in FIG. 6A, the controller 60 operates to place the alignment unit 20 at the calibration execution position, and to start calibration in the alignment unit 20 (S1). The controller 60 operates to image the plurality of reference marks 41 on the calibration stage 40 by the plurality of detection elements 22, and to image the plurality of reference marks 51 on the calibration stage 50 by the plurality of detection elements 23. The controller 60 acquires images of the reference marks 41, and performs image processing to obtain positional deviation amounts of the respective optical axes of the detection elements 22 from target positions. Then, the controller 60 controls the drive mechanisms 25 to drive the detection elements 22, so as to correct the positional deviation amounts of the detection elements 22. The controller 60 acquires images of the reference marks 51, and performs image processing to obtain positional deviation amounts of the respective optical axes of the detection elements 23 from target positions. Then, the controller 60 controls the drive mechanisms 26 to drive the detection elements 23, so as to correct the positional deviation amounts of the detection elements 23.

At this time, the substrate W1 may have been chucked on the chucking stage 11, and the substrate W2 may have been chucked on the chucking stage 12.

As illustrated in FIG. 6B, the controller 60 operates to invert the alignment unit 20 (S2), and to perform calibration in the alignment unit 20. The controller 60 operates to image the plurality of reference marks 41 on the calibration stage 40 by the plurality of detection elements 23, and to image the plurality of reference marks 51 on the calibration stage 50 by the plurality of detection elements 22. The controller 60 acquires images of the reference marks 41, and performs image processing to obtain positional deviation amounts of the respective optical axes of the detection elements 23 from target positions and a positional deviation amount between the calibration stages 40 and 50. Then, the controller 60 controls the drive mechanisms 26 to drive the detection elements 23, so as to correct the positional deviation amounts of the detection elements 23 and the positional deviation amount between the calibration stages 40 and 50. The controller 60 acquires images of the reference marks 51, and performs image processing to obtain positional deviation amounts of the detection elements 22 and a positional deviation amount between the calibration stages 40 and 50. Then, the controller 60 controls the drive mechanisms 25 to drive the detection elements 22, so as to correct the positional deviation amounts of the detection elements 22 and the positional deviation amount between the calibration stages 40 and 50.

The controller 60 repeats the processing of S1 and S2 (NG at S3) until the positional deviation amount calculated for each of the detection elements 22 and 23 in S1 and S2 falls within an acceptable range.

When the positional deviation amount calculated for each of the detection elements 22 and 23 in S1 and S2 falls within the acceptable range, and thus the position adjustment has succeeded (OK at S3), the controller 60 regards that the alignment unit 20 can now function as the alignment reference, and moves the alignment unit 20 from the calibration execution position to the alignment execution position (S4). The controller 60 controls the guide structure 30 to move the alignment unit 20 from the calibration execution position illustrated in FIG. 6C to the alignment execution position illustrated in FIG. 7A.

Figure 7A:
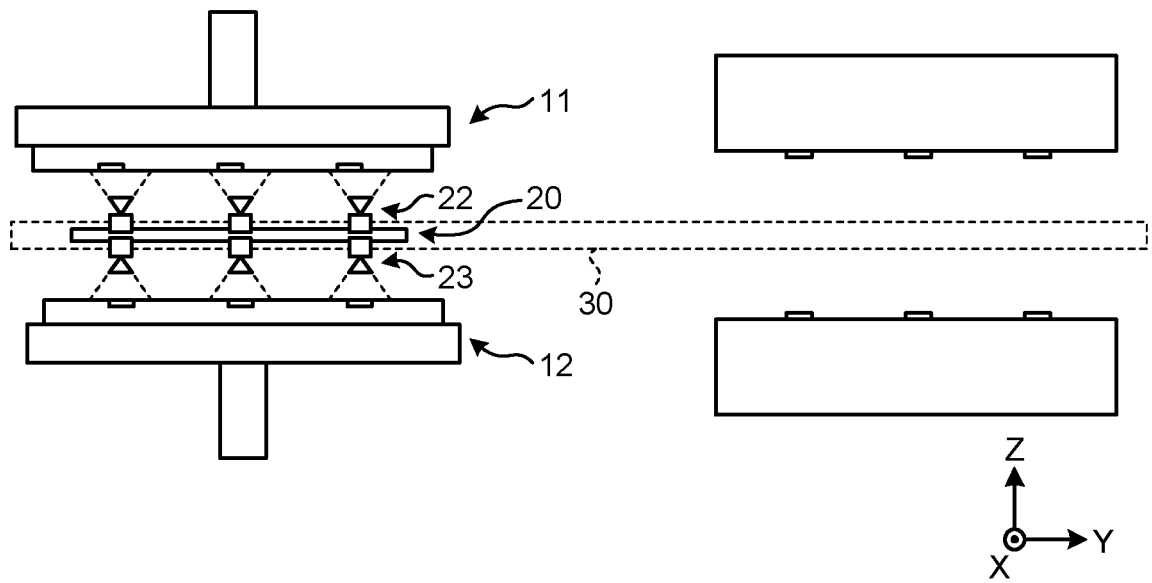
FIGS. 7A and 7B are diagrams illustrating part of the operation of the substrate bonding apparatus according to the embodiment.

Here, in the examples illustrated in FIGS. 6A and 7A, the position adjustment has succeeded in a posture where the detection elements 22 are present on the +Z-side of the base body 21 and the detection elements 23 are present on the −Z-side of the base body 21. When the position adjustment has succeeded in a posture where the detection elements 23 are present on the +Z-side of the base body 21 and the detection elements 22 are present on the −Z-side of the base body 21, the alignment unit 20 is moved as being kept in this posture from the calibration execution position to the alignment execution position.

Figure 7B:
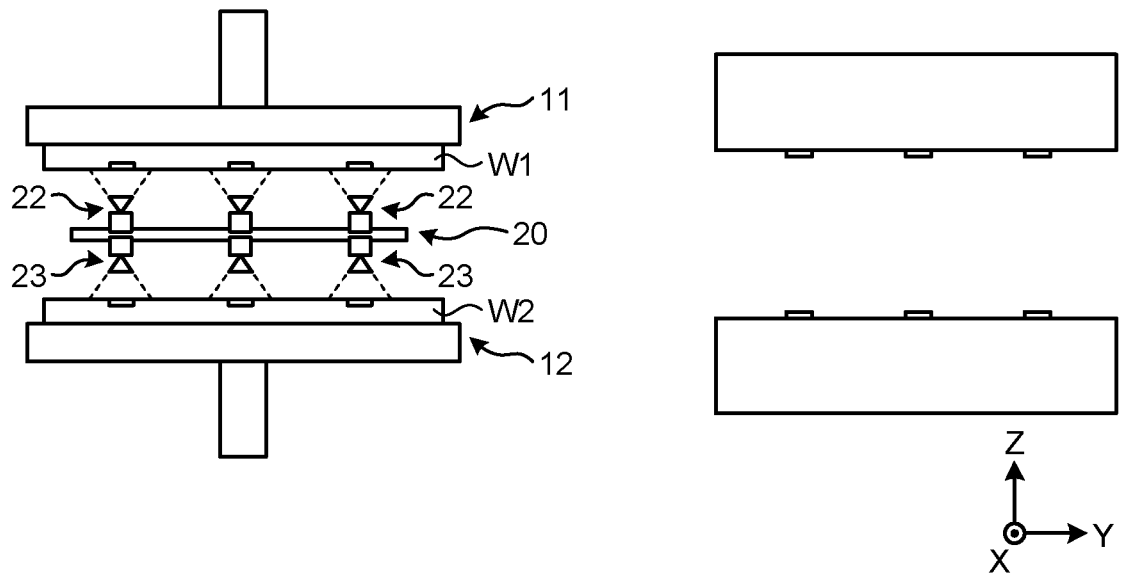

As illustrated in FIG. 7A, in the bonding section 11, the controller 60 controls the alignment unit 20 to image a bonding object electrode pattern on the −Z-side face of the substrate W1 by the detection elements 22, and to image a bonding object electrode pattern on the +Z-side face of the substrate W2 by the detection elements 23. The controller 60 acquires an electrode pattern image on the substrate W1 and an electrode pattern image on the substrate W2, and performs image processing to obtain a positional deviation amount between the substrate W1 and the substrate W2. Then, as illustrated in FIG. 7B, the controller 60 controls drive mechanisms (not illustrated) for the chucking stages to drive the chucking stage 11 and the chucking stage 12 relative to each other in the X- and Y-directions, so as to correct the positional deviation amount between the substrate W1 and the substrate W2. The controller 60 repeats this processing (NG at S11) until the positional deviation amount thus obtained falls within an acceptable range. Consequently, the substrate W1 and the substrate W2 are accurately aligned with each other.

When the positional deviation amount obtained falls within the acceptable range, and thus the mutual alignment has succeeded (OK at S11), the controller 60 regards that the alignment by the alignment unit 20 has been completed, and operates to cause the alignment unit 20 to retreat from the alignment execution position to the calibration execution position (S12). The controller 60 controls the guide structure 30 to cause the alignment unit 20 to retreat from the alignment execution position illustrated in FIG. 7B to the calibration execution position illustrated in FIG. 8A.

Figure 8A:
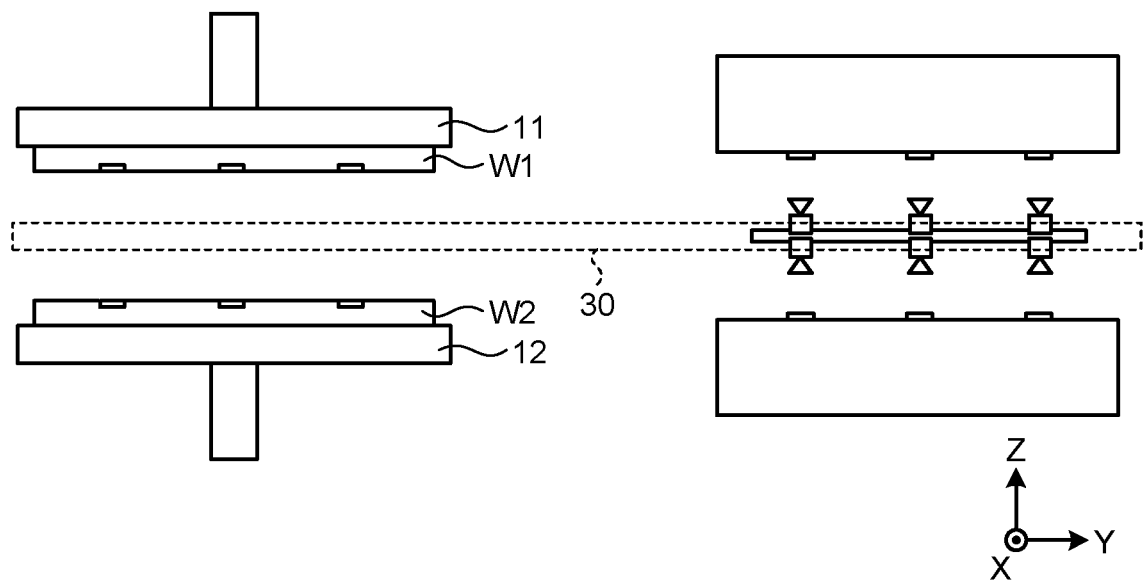
FIGS. 8A and 8B are diagrams illustrating part of the operation of the substrate bonding apparatus according to the embodiment.
Figure 8B:
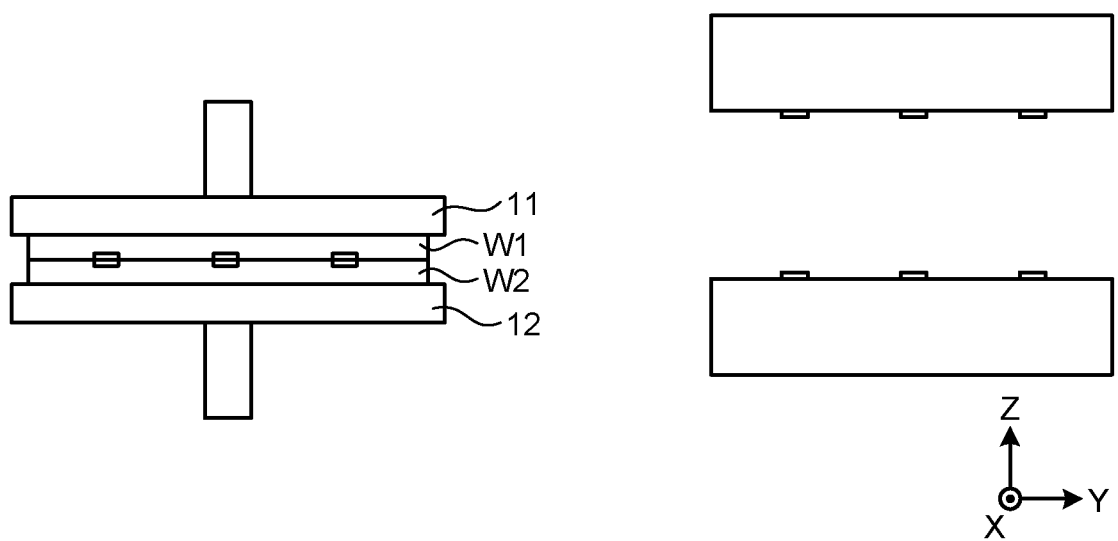

As illustrated in FIG. 8B, the controller 60 controls the drive mechanisms (not illustrated) for the chucking stages to move the chucking stage 11 downward in the −Z-direction (S13) so as to bring the substrate W1 into contact with the substrate W2. Consequently, bonding between the substrate W1 and the substrate W2 is performed (S14).

On the other hand, after the retreatment of the alignment unit 20 to the calibration execution position in S12, when there are no substrates to be mutually bonded in the bonding section 10 (No at S5), the controller 60 sets the alignment unit 20 on standby. However, when there are substrates to be mutually bonded in the bonding section 10 (Yes at S5), the controller 60 returns the processing sequence back to S1, and performs calibration in the alignment unit 20 for the next substrates. Thus, the calibration in the alignment unit 20 can be efficiently performed in parallel with the bonding between the substrates W1 and W2 in the bonding section 11.

As described above, in the substrate bonding apparatus 1 according to the embodiment, the alignment unit 20 provided with the detection elements 22 and 23 on the opposite faces 21a and 21b is inserted between the two chucking stages 11 and 12 in a state where the detection elements 22 and 23 on the opposite faces 21a and 21 are mutually aligned. Then, the detection elements 22 and 23 on the opposite faces 21a and 21b of the alignment unit 20 are used to perform alignment between the two substrates W1 and W2. Consequently, the alignment unit 20 can be used as an absolute alignment reference to directly perform alignment between the bonding objects (such as electrode patterns) of the substrates W1 and W2. As a result, it is possible to realize an improvement in the bonding accuracy between the two substrates W1 and W2 at a high speed and at a low cost, in the substrate bonding apparatus 1.

Here, in a case where the reference marks 41 on the calibration stage 40 and the reference marks 51 on the calibration stage 50 have been subjected to accurate alignment therebetween, the process of obtaining a positional deviation between the calibration stages 40 and 50 may be omitted. In this case, S2 illustrated in FIG. 5 may be omitted.

Figure 9:
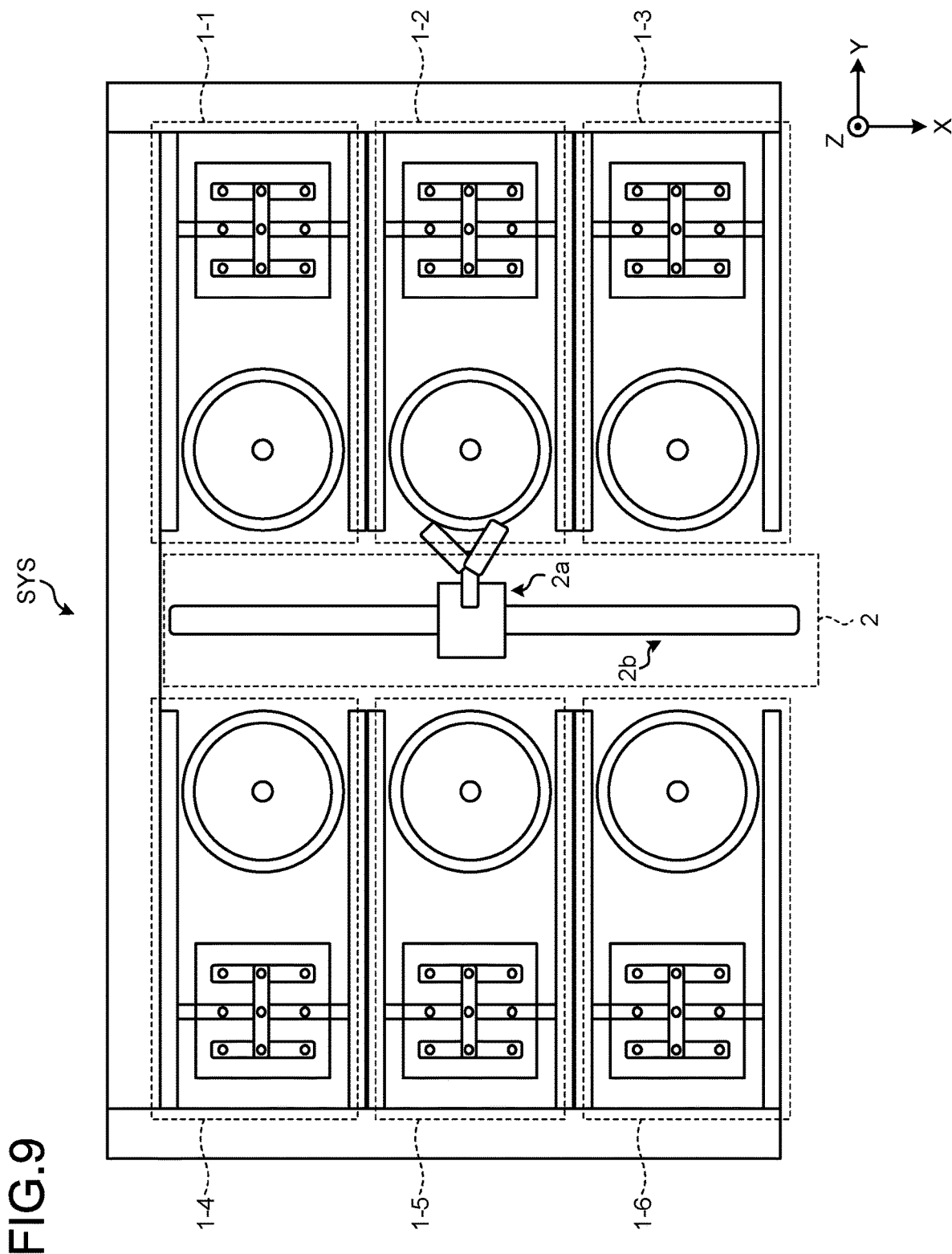
FIG. 9 is a plan view illustrating a configuration of a manufacturing system including substrate bonding apparatuses according a modification of the embodiment.

Further, the substrate bonding apparatus 1 may be used for application to a manufacturing system SYS as illustrated in FIG. 9. FIG. 9 is a plan view illustrating a configuration of the manufacturing system SYS including substrate bonding apparatuses 1 according a modification of the embodiment. The manufacturing system SYS includes a plurality of substrate bonding apparatuses 1-1 to 1-6 and a conveyance system 2. Each of the substrate bonding apparatuses 1-1 to 1-6 may be configured as in the substrate bonding apparatus 1 according to the embodiment. The conveyance system 2 is disposed in a state of extending transversely among the respective substrate bonding apparatuses 1-1 to 1-6.

For example, the conveyance system 2 includes a conveyance rail 2b extending in the X-direction and a transfer robot 2a that can travel in the X-direction along the conveyance rail 2b. The substrate bonding apparatuses 1-1 to 1-3 are disposed on the +Y-side of the conveyance system 2, and are arrayed in the X-direction along the conveyance rail 2b. The substrate bonding apparatuses 1-4 to 1-6 are disposed on the −Y-side of the conveyance system 2, and are arrayed in the X-direction along the conveyance rail 2b.

Thus, the parallel processing of the bonding between substrates W1 and W2 in each bonding section 11 with the calibration in the corresponding alignment unit 20 can be performed further in a parallel manner among the plurality of substrate bonding apparatuses 1-1 to 1-6. Consequently, it is possible to perform the calibration in each alignment unit 20 more efficiently.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A substrate bonding apparatus comprising:
a first chucking stage configured to chuck a first substrate;
a second chucking stage disposed facing the first chucking stage, and configured to chuck a second substrate; and
an alignment unit configured to be inserted between the first chucking stage and the second chucking stage,
wherein the alignment unit includes
a base body including a first main face and a second main face opposite to the first main face,
a first detection element disposed on the first main face, and
a second detection element disposed on the second main face,
wherein the alignment unit is provided with the first detection element and the second detection element to be movable independently of each other,
the substrate bonding apparatus further comprising a controller configured to operate to perform alignment between a first optical axis of the first detection element and a second optical axis of the second detection element, and to insert the alignment unit between the first chucking stage and the second chucking stage in a state where the first optical axis and the second optical axis are aligned with each other.

2. The substrate bonding apparatus according to claim 1, wherein
the alignment unit further includes
a first drive mechanism configured to move the first detection element along the first main face, and
a second drive mechanism configured to move the second detection element along the second main face, and
the substrate bonding apparatus further comprises
a first calibration stage disposed on a side to face the first main face of the base body, and including a first reference mark, and
a second calibration stage disposed on a side to face the second main face of the base body, and including a second reference mark.

3. The substrate bonding apparatus according to claim 2, further comprising
a guide structure configured to guide a move of the alignment unit between a calibration execution position and an alignment execution position, the calibration execution position being a position between the first calibration stage and the second calibration stage, the alignment execution position being a position between the first chucking stage and the second chucking stage.

4. The substrate bonding apparatus according to claim 3, wherein
the guide structure includes
a first guide rail extending from the calibration execution position to the alignment execution position,
a support arm supporting the base body and configured to slide along the first guide rail,
a third drive mechanism configured to cause the base body to slide along the support arm, and
a fourth drive mechanism configured to cause the support arm to slide along the first guide rail.

5. The substrate bonding apparatus according to claim 4, wherein the third drive mechanism is configured to rotate the base body about an axis of the support arm.

6. The substrate bonding apparatus according to claim 4, wherein
the guide structure further includes
a second guide rail disposed opposite to the first guide rail with the base body interposed therebetween, and extending from the calibration execution position to the alignment execution position, and
a fifth drive mechanism configured to cause the support arm to slide along the second guide rail, and
the support arm is configured to slide along the first guide rail and the second guide rail.

7. The substrate bonding apparatus according to claim 3, wherein
the controller is configured to operate to set the first chucking stage and the second chucking stage closer to each other at the alignment execution position, and to bond the first substrate and the second substrate to each other.

8. The substrate bonding apparatus according to claim 7, wherein
the controller executes control to perform bonding between the first substrate and the second substrate at the alignment execution position, and calibration in the alignment unit at the calibration execution position, in parallel with each other.

9. The substrate bonding apparatus according to claim 3, wherein
the guide structure is configured to invert the alignment unit when the align alignment unit is present at the calibration execution position.

10. The substrate bonding apparatus according to claim 2, wherein
the alignment unit further includes
a first rail connected to the base body on the first main face, and configured to allow the first detection element to slide thereon, and
a second rail connected to the base body on the second main face, and configured to allow the second detection element to slide thereon,
the first drive mechanism is configured to cause the first detection element to slide along the first rail, and
the second drive mechanism is configured to cause the second detection element to slide along the second rail.

11. The substrate bonding apparatus according to claim 2, wherein
the controller is configured to control the first drive mechanism and the second drive mechanism to align a first optical axis of the first detection element with the first reference mark and to align a second optical axis of the second detection element with the second reference mark, in a state where the alignment unit is present at a calibration execution position between the first calibration stage and the second calibration stage.

12. The substrate bonding apparatus according to claim 1, wherein
the alignment unit is configured to acquire an image of the first substrate by the first detection element and acquire an image of the second substrate by the second detection element, in a state where the alignment unit is inserted between the first chucking stage and the second chucking stage, and
the controller is configured to control the first chucking stage and the second chucking stage to correct a positional deviation between the first substrate and the second substrate in accordance with the image of the first substrate and the image of the second substrate thus acquired.

13. A manufacturing system comprising:
a plurality of substrate bonding apparatuses, each of which is the substrate bonding apparatus according to claim 1; and
a conveyance system disposed in a state of extending transversely among the plurality of substrate bonding apparatuses, wherein
the plurality of substrate bonding apparatuses are configured to allow parallel processing, which includes bonding between a plurality of substrates and calibration in an alignment unit, to be performed in a parallel manner among the substrate bonding apparatuses.

14. A semiconductor device manufacturing method comprising:
performing alignment between a first optical axis of a first detection element and a second optical axis of a second detection element, for an alignment unit, which includes a base body including a first main face and a second main face opposite to the first main face, the first detection element disposed on the first main face, and the second detection element disposed on the second main face;
inserting the alignment unit between a first chucking stage that chucks a first substrate and a second chucking stage that is disposed facing the first chucking stage, and chucks a second substrate, in a state where the first optical axis and the second optical axis are aligned with each other,
correcting a positional deviation between the first substrate and the second substrate by using the alignment unit; and
bonding the first substrate and the second substrate to each other, after the correcting, to manufacture a semiconductor device.

15. The semiconductor device manufacturing method according to claim 14, wherein
the performing alignment between a first optical axis and a second optical axis includes
positioning the alignment unit between a first calibration stage disposed on a side to face the first main face of the base body and including a first reference mark and a second calibration stage disposed on a side to face the second main face of the base body and including a second reference mark, and
aligning the first optical axis with the first reference mark and aligning the second optical axis with the second reference mark in a state where the alignment unit is positioned between the first calibration stage and the second calibration stage.

16. The semiconductor device manufacturing method according to claim 14, wherein
the correcting a positional deviation includes
acquiring an image of the first substrate by the first detection element and acquiring an image of the second substrate by the second detection element in a state where the alignment unit is inserted between the first chucking stage and the second chucking stage, and
controlling the first chucking stage and the second chucking stage to correct a positional deviation between the first substrate and the second substrate in accordance with the image of the first substrate and the image of the second substrate thus acquired.

* * * * *